United States Patent
Ting et al.

(10) Patent No.: US 8,881,078 B2
(45) Date of Patent: *Nov. 4, 2014

(54) PROPRIETARY CIRCUIT LAYOUT IDENTIFICATION

(71) Applicant: ARM Limited, Cambridge (GB)

(72) Inventors: Albert Li Ming Ting, Sunnyvale, CA (US); Shun-Piao Su, Saratoga, CA (US)

(73) Assignee: ARM Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,437

(22) Filed: Feb. 6, 2013

(65) Prior Publication Data

US 2013/0246984 A1    Sep. 19, 2013

Related U.S. Application Data

(63) Continuation of application No. 12/385,765, filed on Apr. 17, 2009, now Pat. No. 8,397,193.

(51) Int. Cl.
*G06F 9/455* (2006.01)
*G06F 17/50* (2006.01)

(52) U.S. Cl.
CPC ........ *G06F 17/5045* (2013.01); *G06F 17/5081* (2013.01)
USPC ............. 716/107; 716/55; 716/106; 716/111; 716/112

(58) Field of Classification Search
CPC ............ G06F 17/5081; G06F 17/5045; G06T 2207/10061
USPC .............. 716/52–56, 106–107, 111–112, 136
See application file for complete search history.

(56) References Cited

U.S. PATENT DOCUMENTS

| 5,086,477 A | 2/1992 | Yu et al. |
| 5,875,112 A | 2/1999 | Lee |
| 7,028,276 B2 | 4/2006 | Balaji et al. |

(Continued)

FOREIGN PATENT DOCUMENTS

| CN | 1770166 | 5/2006 |
| CN | 1834969 | 9/2006 |
| JP | 4-178772 | 6/1992 |
| JP | 2007-128383 | 5/2007 |

OTHER PUBLICATIONS

VSI Alliance "Virtual Component Identification Physical Tagging Standard" (IPP 1.3.0), Jun. 2000, pp. 1-6.

(Continued)

*Primary Examiner* — Nha Nguyen
(74) *Attorney, Agent, or Firm* — Nixon & Vanderhye P.C.

(57) ABSTRACT

A method is provided for identifying use of a proprietary circuit layout. A representation of a layout of a circuit is input and the locations of a set of predetermined physical features of the circuit are identified. This set of locations is then compared with a previously generated characteristic pattern file, the characteristic pattern file comprising a representation of relative locations of a set of these predetermined physical features in the proprietary circuit layout. If the set of locations matches the relative locations of the characteristic pattern file, then an output is generated indicating that use of the proprietary circuit design has been found.

17 Claims, 5 Drawing Sheets

(56) References Cited

U.S. PATENT DOCUMENTS

| | | |
|---|---|---|
| 7,555,736 B2 | 6/2009 | Cadouri |
| 7,644,383 B2 | 1/2010 | Bartling et al. |
| 7,707,542 B1 | 4/2010 | Gennari et al. |
| 2005/0188338 A1 | 8/2005 | Kroyan et al. |
| 2006/0045325 A1* | 3/2006 | Zavadsky et al. ............. 382/145 |
| 2007/0198958 A1 | 8/2007 | Tang et al. |
| 2007/0240086 A1 | 10/2007 | Sinha et al. |
| 2008/0005713 A1 | 1/2008 | Singh et al. |
| 2008/0010623 A1 | 1/2008 | Koizumi |
| 2008/0059927 A1* | 3/2008 | Ludwig et al. .................... 716/5 |
| 2008/0109773 A1 | 5/2008 | Douriet |
| 2008/0244483 A1 | 10/2008 | Chang et al. |
| 2008/0263484 A1 | 10/2008 | Kobayashi |

OTHER PUBLICATIONS

A. Garimella et al, "VLSI Implementation of Online Digital Watermarking Technique with Difference Encoding for 8-Bit Gray Scale Images" *Proceedings of the 16th International Conference on VLSI Design (VLSI'03)*, 2003, 6 pages.

International Search Report and Written Opinion of the International Searching Authority dated Jun. 29, 2010 for PCT/GB2009/002851.

H. Yao et al, "Efficient range pattern matching algorithm for process-hotspot detection" *IET Circuits Devices Syst.*, vol. 2, No. 1, Feb. 2008, pp. 2-15.

N. Ma et al, "Automatic hotspot classification using pattern-based clustering" *Proc. of SPIE*, vol. 6925, Mar. 2008.

English translation of Chinese Office Action issued May 14, 2013 in CN 20098015877.4.

* cited by examiner

PROPRIETARY CIRCUIT LAYOUT IDENTIFICATION

This application is a Continuation of application Ser. No. 12/385,765, filed Apr. 17, 2009, the entire contents of which are hereby incorporated by reference.

BACKGROUND OF THE INVENTION

1. Field of the Invention

The present invention relates to proprietary circuit layouts. More particularly, this invention relates to the identification of the use of a proprietary circuit layout.

2. Description of the Prior Art

The owners of proprietary circuit layouts may wish to gather royalty payments from those who choose to design, manufacture and/or use circuitry incorporating such proprietary circuit layouts. However, whilst most manufacturers and end users will make royalty payments to the owner fairly corresponding to their usage of these proprietary circuit layouts, the complexity of modern circuit designs may mean that some royalties are not gathered, due to the difficulties of tracking the usage of particular proprietary circuit layouts.

For this reason, in order to seek to identify usage of their proprietary circuit layouts, it is known for proprietary circuit layout owners to add information to their circuit layouts which will enable them later to readily identify a given circuit as containing one or more of their proprietary circuit layouts. For example, a circuit designer who issues circuit layouts in the form of an IP library may embed tagging data within the circuit layouts held in that IP library, relying on techniques for identifying that embedded tagging data at a later stage in the circuit production process to identify usage of their proprietary circuit layouts. Such a technique is described in the document "Virtual Component Identification Physical Tagging Standard 1.3.0, Revision 3.0 Released June 2006." However, a significant drawback of this technique is that the end user, the foundry or integrated device manufacturer (IDM) can inadvertently remove this tagging data, or even intentionally remove it, such that identification of the proprietary circuit layout by this method is not possible thereafter.

An alternative technique for embedding tagging information is "watermarking" such as that described in "VLSI Implementation of Online Digital Watermarking Technique with Difference Encoding for 8-Bit Gray Scale Images", Garimella et al., VLSID pp. 283, $16^{th}$ International Conference on VLSI Design, 2003-1063-9667/03 IEEE. This describes a method of adding information to proprietary digital content to identify the owner of that digital content.

All such prior art techniques suffer from the same fundamental disadvantage, that tagging data or watermarks must not only be added in the first place, but can still be removed either accidentally or intentionally, and the circuit designer then loses the ability to track use of his proprietary circuit layouts for royalty purposes.

Hence, it would be desirable to provide an improved technique for identifying use of proprietary circuit layouts.

SUMMARY OF THE INVENTION

Viewed from a first aspect, the present invention provides a method of generating a characteristic pattern file to be used to identify use of a proprietary circuit layout, the method comprising the steps of: inputting a layout database file comprising a representation of said proprietary circuit layout; extracting relative locations of a set of predetermined physical features of said proprietary circuit layout from said layout database file; and generating said characteristic pattern file comprising a representation of said relative locations of said set of predetermined physical features of said proprietary circuit layout.

The inventors of the present invention realised that identification of the use of a proprietary circuit layout could be carried out, without the need to embed or append additional information to that proprietary circuit layout. In particular they realised that a proprietary circuit layout could be identified with a high level of certainty, by reference to the relative locations of a set of predetermined physical features of the proprietary circuit layout.

Furthermore, the inventors realised that it is possible to identify the relative locations of this set of predetermined physical features from a layout database file (for example an 'IP library') comprising a representation of the proprietary circuit layout. Here the term "relative locations" should be understood to encompass absolute locations (e.g. a set of defined coordinates in a specified coordinate system) as well as a set of coordinates that are only defined relative to one another. By doing this a characteristic pattern file comprising a representation of these relative locations can be generated, for use in later identifying use of that proprietary circuit layout.

In other words, the techniques of the present invention seek to identify a proprietary circuit layout based on physical, non-removable, characteristics of the circuit, rather than on watermarks or tagging that could be removed. Two advantages of this approach are that on the one hand no modification of the circuit layout is required (e.g. no tagging data needs adding), whilst on the other hand identification of the proprietary circuit layout relies on physical characteristics of the circuit itself, which thus could not be removed by an end user without compromising the function of the circuit. The techniques of the present invention have the further advantage that they are "backwards compatible" to circuits produced even before these techniques were first put into practice, since the identification relies on inherent components of the circuit and not on particular added tags or watermarks.

It will be recognised that there are a number of ways that the relative locations could be extracted. In one embodiment the extracting step comprises: parsing said layout database file to identify elements indicative of said set of predetermined physical features; and determining said relative locations of said set of predetermined physical features from said elements. The layout database file may well comprise a considerable amount of information beyond that necessary to identify these predetermined physical features, so it is advantageous to first parse the layout database file to identify elements which are indicative of the set of predetermined physical features, and then to determine the relative locations of the set of predetermined physical features from those elements.

The elements selected to permit identification of the predetermined physical features could take a variety of forms, but in one embodiment the identification is performed on a geometrical basis and the elements comprise geometric shapes representing the predetermined physical features.

It may be the case that a given type of predetermined physical features will provide a sufficiently numerous set for the identification purposes of the present invention. However in one embodiment, if a count of a first type of predetermined physical features is less than a predetermined lower limit defined by an extraction rule, at least a second type of predetermined physical features is included in said set of predetermined physical features. Thus, by the inclusion of at least one further type of predetermined physical features the population of the set is increased, such that subsequent identification using this set is then more reliable.

Whilst the layout database file could only contain a representation of a single proprietary circuit layout, in one embodiment the layout database file is a library of proprietary circuit layouts and thus the layout database file comprises representations of a plurality of proprietary circuit layouts.

When the layout database file comprises multiple proprietary circuit layouts in this manner, it can be advantageous to select a particular proprietary circuit layout from which to extract the relative locations of the set of predetermined physical features and in one embodiment the extracting step comprises selecting said proprietary circuit layout from amongst said plurality of proprietary circuit layouts in dependence on an extraction rule.

It will be recognised that various extraction rules could be defined in this context, but in one advantageous embodiment the extraction rule comprises a constraint on a count of said predetermined physical features in said proprietary circuit layout. It has been found that if the count of the predetermined physical features in a given proprietary circuit layout is too low, then the resulting relative locations that are extracted would risk too many false positive identifications of use of the proprietary circuit layout. On the other hand, it has been found that if the count of the predetermined physical features in a given proprietary circuit layout is too high, then the computational resource required to perform use identification on this basis is unattractively high. An extraction rule constraining this count to fall within these two limits is advantageous.

In one embodiment the parsing step is performed with reference to additional information, the additional information comprising at least one of: product information; foundry information; process information; and layer information. This additional information allows the parsing to be carried out in a more targeted fashion, for example with respect to a given layer of the proprietary circuit layout. Whilst the additional information could be derived from a number of sources, in one embodiment the additional information is contained within tapeout information.

The set of predetermined physical features could be arranged in a variety of ways in the proprietary circuit layout, but in one embodiment the set of predetermined physical features is disposed in a predetermined layer of said proprietary circuit layout. This advantageously simplifies the identification process.

In one embodiment the extracting step is performed with reference to a predetermined set of extraction rules. These extraction rules may for example govern the manner in which the extraction is carried out, the format of the relative locations extracted, the nature of the set of predetermined physical features, and so on.

Whilst all of the examples of a predetermined physical feature that are identified in a proprietary circuit layout could be used, in one embodiment the extracting step comprises selecting a subset of said predetermined physical features as said set of predetermined physical features.

It will be recognised that the layout database file could have many different formats. In one embodiment the layout database file comprises at least one GDSII (Graphical Data System II format) file. In another embodiment the layout database file comprises at least one of an OASIS (Open Artwork System Interchange Standard format) file; a GERBER file; and a DXF file.

Whilst various different varieties of physical feature could in principle be used, it has been found to be advantageous when said set of predetermined physical features comprises a set of contacts of said proprietary circuit layout. In particular it is advantageous when these contacts are metal-poly contacts. Such features present a set which are readily identified when generating the characteristic pattern file and which typically occur in numbers suitable for the present identification purposes. However, if a second type of predetermined physical features is required in order to supplement the numbers of the set, in one embodiment the first type of predetermined physical features comprises metal-poly contacts and the second type of predetermined physical features comprises diffusion contacts.

Other example physical features can be used. In another embodiment the set of predetermined physical features comprises features of said proprietary circuit layout selected from: features in a diffusion layer; features in a metal layer; vias; and transistor locations and/or sizes.

For the purposes of simplifying the generation of the characteristic pattern file and its later comparison to a circuit under investigation, in one embodiment the relative locations of said set of predetermined physical features of said proprietary circuit layout are defined by relative origins of said set of predetermined physical features.

The set of predetermined physical features could in principle be any physical features of the proprietary circuit layout, but in one embodiment the set of predetermined physical features comprises circuitry components of said proprietary circuit layout. This results in a particularly durable identification method, since circuitry components are by their nature inherent to the function of the proprietary circuit layout and thus their removal is likely to compromise that function.

Viewed from a second aspect, the present invention provides a method of identifying use of a proprietary circuit layout, the method comprising the steps of: inputting a representation of a layout of a circuit; identifying locations of a test set of predetermined physical features of said circuit from said representation; comparing said locations with a previously generated characteristic pattern file, said characteristic pattern file comprising a representation of relative locations of a characteristic set of predetermined physical features in said proprietary circuit layout; and generating an output indicative of a result of said comparing step.

Further to the discussion of the first aspect of the present invention, in a related fashion the second aspect of the present invention allows identification of the use of a proprietary circuit layout to be carried out, without the need to refer to previously embedded or appended additional information. Usage of a proprietary circuit layout can thus be identified with a high level of certainty, and without a burdensome number of false positive identifications, by comparison to a previously generated characteristic pattern file comprising a representation of the relative locations of a set of predetermined physical features of the proprietary circuit layout.

It will be recognised that there are a number of ways that the step of identifying locations could be performed. In one embodiment the identifying step comprises: parsing said representation to identify elements indicative of said test set of predetermined physical features; and determining said locations of said test set of predetermined physical features from said elements. The representation may well comprise a considerable amount of information beyond that necessary to identify these predetermined physical features, so it is advantageous to first parse the representation to identify elements which are indicative of the test set of predetermined physical features, and then to determine the locations of the test set of predetermined physical features from those elements.

The elements selected to permit identification of the predetermined physical features could take a variety of forms, but in one embodiment the identification is performed on a geometrical basis and the elements comprise geometric shapes representing said test set of predetermined physical features.

It may be the case that the locations of the test set of predetermined physical features of the circuit may cover a larger area than the relative locations represented in the characteristic pattern file and in one embodiment the comparing step comprises panning across said locations of said test set of predetermined physical features to seek a match with said characteristic set of predetermined physical features.

In one embodiment the parsing step is performed with reference to additional information comprised in said representation, said additional information comprising at least one of: product information; foundry information; process information; and layer information. This additional information allows the parsing to be carried out in a more targeted fashion, for example with respect to a given layer of the circuit. Indeed in one embodiment the set of predetermined physical features is disposed in a predetermined layer of said circuit.

It will be recognised that the representation could have many different formats. In one embodiment the representation of said layout of said circuit comprises a GDSII tapeout. In another embodiment the representation of said layout of said circuit comprises at least one of: an OASIS file; a GERBER file; and a DXF file.

Whilst various different varieties of physical feature could in principle be used, it has been found to be advantageous when said test set of predetermined physical features comprises a set of contacts of said circuit. In particular it is advantageous when these contacts are metal-poly contacts. Such features present a set which are readily identified in the representation of the layout of the circuit.

Other example physical features can be used. In another embodiment the test set of predetermined physical features comprises features of said circuit selected from: features in a diffusion layer; features in a metal layer; vias; and transistor locations and/or sizes.

For the purposes of simplifying the comparison of the locations with the previously generated characteristic pattern file, in one embodiment the locations of said test set of predetermined physical features of said circuit are defined by relative origins of said set of predetermined physical features.

The test set of predetermined physical features could in principle be any physical features of the circuit, but in one embodiment the test set of predetermined physical features comprises circuitry components of said circuit. This results in a particularly durable identification method, since circuitry components are by their nature inherent to the function of the circuit and thus their removal is likely to compromise that function.

Viewed from a third aspect, the present invention provides a data processing apparatus for generating a characteristic pattern file to be used to identify use of a proprietary circuit layout, the data processing apparatus comprising: input circuitry configured to input a layout database file comprising a representation of said proprietary circuit layout; extraction circuitry configured to extract relative locations of a set of predetermined physical features of said proprietary circuit layout from said layout database file; and generation circuitry configured to generate said characteristic pattern file comprising a representation of said relative locations of said set of predetermined physical features of said proprietary circuit layout.

Viewed from a fourth aspect, the present invention provides a data processing apparatus for generating a characteristic pattern file to be used to identify use of a proprietary circuit layout, the data processing apparatus comprising: input means for inputting a layout database file comprising a representation of said proprietary circuit layout; extraction means for extracting relative locations of a set of predetermined physical features of said proprietary circuit layout from said layout database file; and generation means for generating said characteristic pattern file comprising a representation of said relative locations of said set of predetermined physical features of said proprietary circuit layout.

Viewed from a fifth aspect, the present invention provides a computer-readable storage medium storing a computer program which when executed causes a computer to carry out the method according to the first aspect.

Viewed from a sixth aspect, the present invention provides a data processing apparatus for identifying use of a proprietary circuit layout, the data processing apparatus comprising: input circuitry configured to input a representation of a layout of a circuit; identification circuitry configured to identify locations of a test set of predetermined physical features of said circuit from said representation; comparison circuitry configured to compare said locations with a previously generated characteristic pattern file, said characteristic pattern file comprising a representation of relative locations of a characteristic set of predetermined physical features in said proprietary circuit layout; and generation circuitry configured to generate an output indicative of a result of said comparing step.

Viewed from a seventh aspect, the present invention provides a data processing apparatus for identifying use of a proprietary circuit layout, the data processing apparatus comprising: input means for inputting a representation of a layout of a circuit; identification means for identifying locations of a test set of predetermined physical features of said circuit from said representation; comparison means for comparing said locations with a previously generated characteristic pattern file, said characteristic pattern file comprising a representation of relative locations of a characteristic set of predetermined physical features in said proprietary circuit layout; and generation means for generating an output indicative of a result of said comparing step.

Viewed from an eighth aspect, the present invention provides a computer-readable storage medium storing a computer program which when executed causes a computer to carry out the method of the second aspect.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
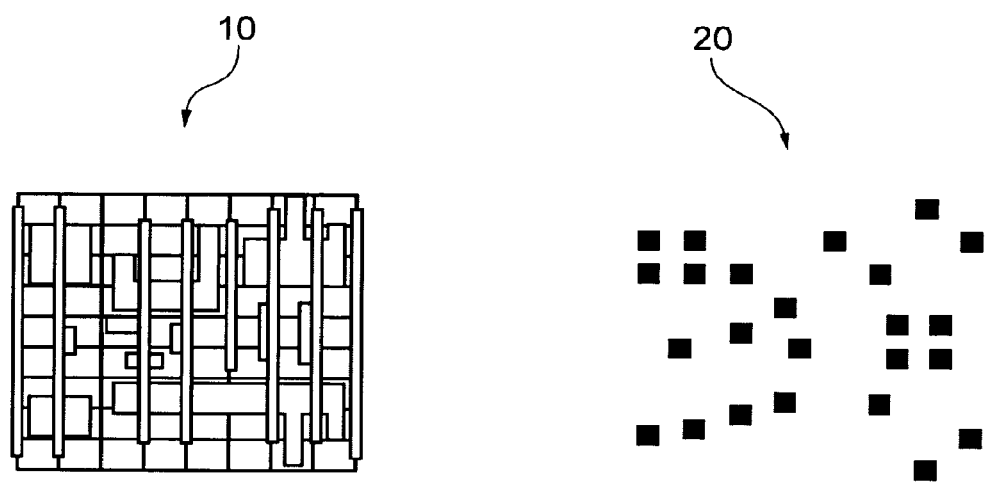
FIG. 1 schematically represents a proprietary circuit layout and the extracted relative locations of a set of predetermined physical features of that proprietary circuit layout.

FIG. 1 schematically illustrates a plan view of a proprietary circuit layout generally indicated 10. This proprietary circuit layout 10 is composed of different components typically arranged over several layers. These components include metal layer features, poly layer features, metal-poly contacts, diffusion contacts, diffusion layer features and vias. Also illustrated in FIG. 1 and generally indicated as 20 are a set of points indicating the relative locations of the metal-poly contacts in proprietary circuit layout 10. In other words, the collection of points 20 illustrates the proprietary circuit layout 10 when all components other than the metal-poly contacts have been removed. The set of metal-poly contact locations 20 thus represents a pattern which is characteristic of the proprietary circuit layout, and may be used to identify the use of proprietary circuit layout 10 in a circuit under manufacture as is described hereinafter.

Figure 2:
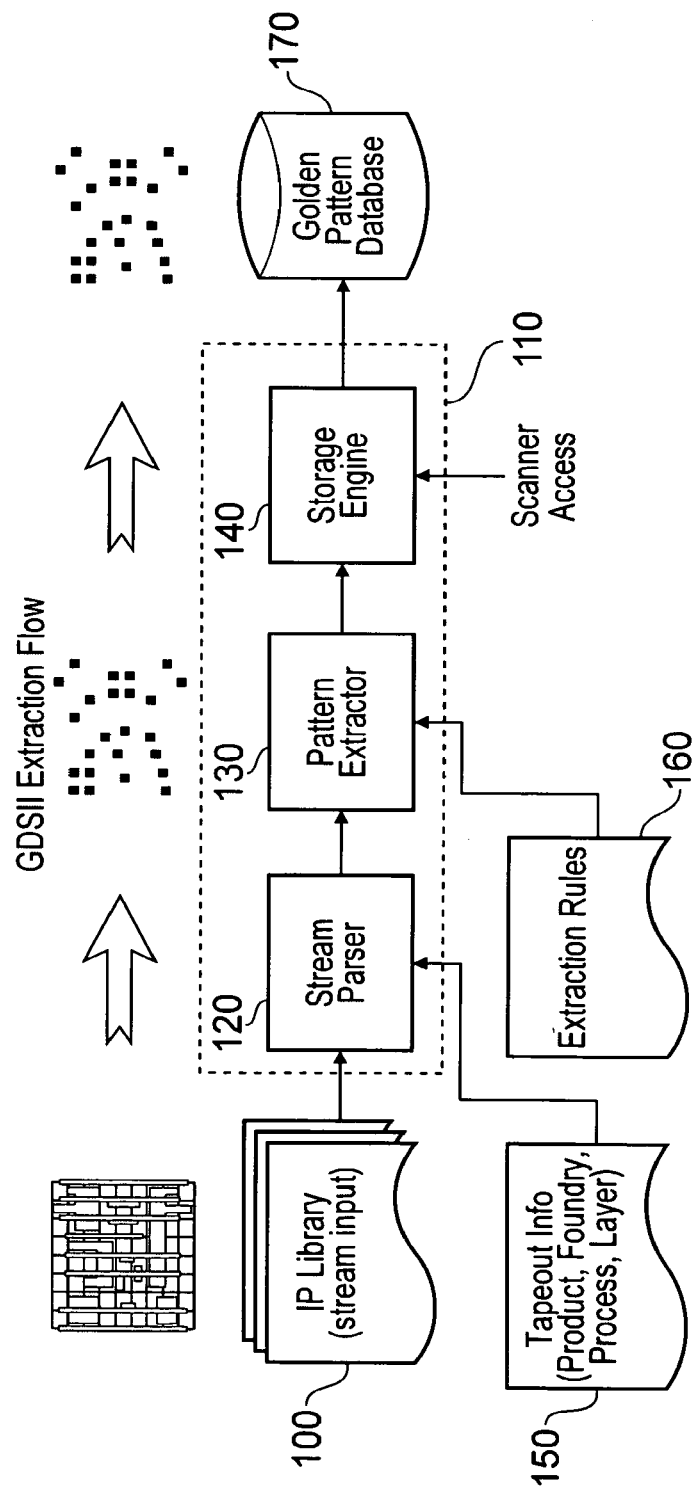
FIG. 2 schematically represents a series of modules for extracting relative locations of a set of predetermined physical features and generating a characteristic pattern file.

FIG. 2 schematically illustrates the process of extracting relative locations of a set of predetermined physical features and generating a characteristic pattern file. The process begins with IP library 100, which contains representations of the layout of a number of proprietary circuit layouts. In general the IP library may comprise memory, standard cell and IO libraries. In this example, the IP library database is hierarchically arranged in GDSII format, providing a memory efficient storage format. Proprietary circuit layouts that are reused many times (e.g. a flip-flop layout) exist as 'leaf cells' at the lowest level of the hierarchy.

The IP library 100 forms the stream input for characteristic pattern file generator 110, which is embodied in a general purpose computer. The characteristic pattern file generator comprises stream parser 120, pattern extractor 130 and storage engine 140. Thus it can be seen that in this embodiment modules 120, 130 and 140 are provided as software modules, although in another embodiment these modules may be provided as hardware units. Stream parser 120 reformats the stream input into a format suitable for pattern extraction and passes this reformatted data to pattern extractor 130. In this example embodiment, in order to limit memory usage the stream parser parses one leaf cell from the IP library 100 at a time.

The stream parser 120 also operates with reference to tapeout information 150 which represents additional information comprising product information, foundry information, process information and layer information. For example, a leaf cell corresponding to a proprietary circuit layout of a flip-flop is processed by stream parser 120 with reference to the particular layer in which the metal-poly contacts of that flip-flop are arranged. Pattern extractor 130 then identifies the metal-poly contacts from their geometrical representation in that layer (e.g. a set of rectangular features) and generates a characteristic pattern file comprising a representation of the relative locations of this set of metal-poly contacts. These relative locations are generated in this embodiment as the origins (geometrical centres) of each geometrical object. Using the origin of the predetermined physical features has the advantage that adjustments to the size and shape of those features (for example as part of Design For Manufacturability (DFM) or Optical Proximity Correction (OPC) adjustments) will typically not significantly affect the relative origins of those features. Although this embodiment focuses on the relative locations of the set of metal-poly contacts, in other embodiments alternatively (or in addition) the features may be taken from another layer, for example a diffusion layer or a metal layer. Alternatively (or in addition) through-connections between layers such as vias may be used.

The pattern extractor 130 acts with reference to extraction rules 160, which determine how the pattern extraction should be carried out. An example extraction rule is a constraint on the number of metal-poly contacts which the pattern extractor translates into the characteristic pattern file. If for example the number of metal-poly contacts exceeds a predetermined limit, the pattern extractor may choose to ignore some metal-poly contacts according to predetermined rules, or alternatively this particular proprietary circuit layout may be rejected as being unsuitable for generating a characteristic pattern file. Thus the extraction rules can be used to select particular proprietary circuit layouts from the IP library that are deemed particularly suitable for later identification, for example due to the number of metal-poly contacts that they have.

Another example extraction rule causes the pattern extractor to additionally extract the diffusion contacts if the number of metal-poly contacts does not reach a predetermined lower limit. By additionally including the diffusion contacts, the total number of contacts extracted (i.e. the number of elements in the set of predetermined physical features) can be increased such that the characteristic pattern file generated is more reliable for identification of use of this particular proprietary circuit layout.

The generated characteristic pattern file (also known as a 'golden pattern') is passed to storage engine 140 which stores that characteristic pattern file in golden pattern database 170. Typically, the extraction process is performed iteratively on the IP library, parsing one leaf cell at a time and extracting a characteristic pattern if one exists that meets the extraction rules 160.

Figure 3:
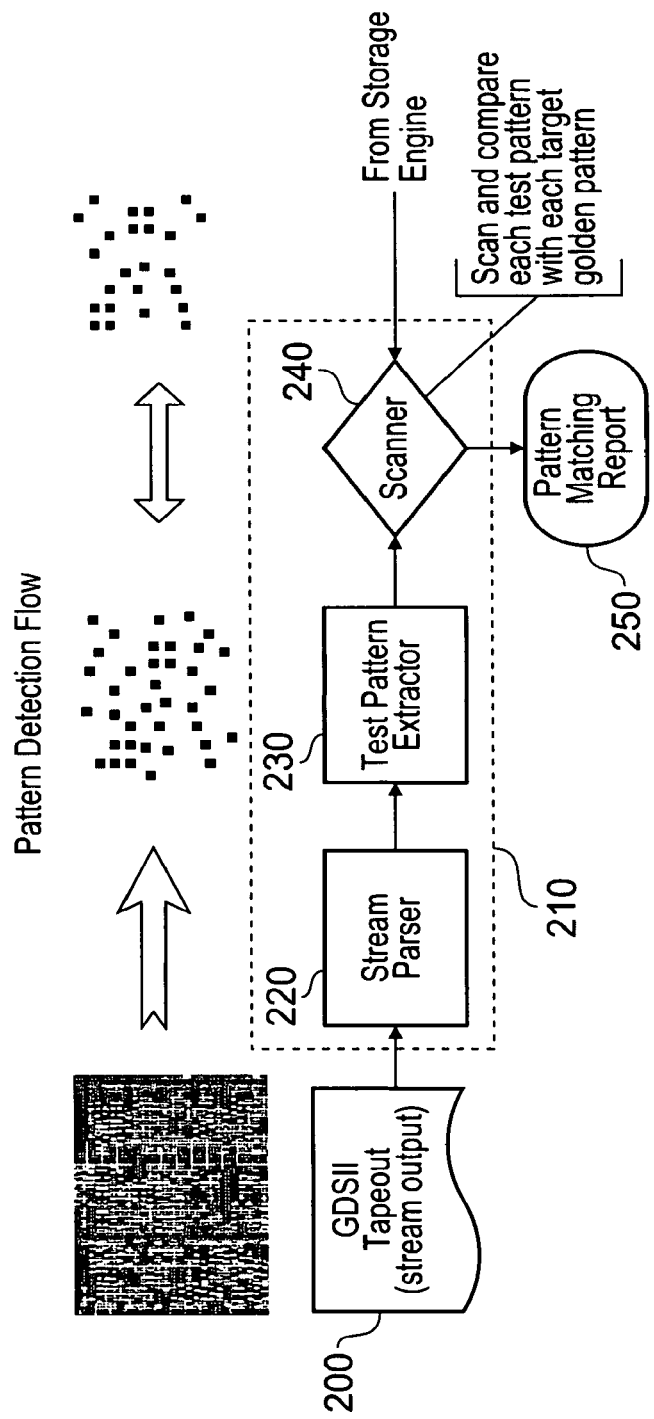
FIG. 3 schematically represents a series of modules for identifying locations of a test set of predetermined physical features of a circuit and comparing those locations with a characteristic pattern file.

FIG. 3 schematically illustrates the process by which the use of a proprietary circuit layout is identified. This process will typically take place at a foundry or integrated device manufacturer (IDM) where an integrated circuit is being produced from a tapeout. Here, a tapeout (in this example in GDSII format) represents the circuit being manufactured. This GDSII tapeout forms the input to pattern comparer 210, which is embodied by a general purpose computer. Pattern comparer 210 comprises stream parser 220, test pattern extractor 230 and scanner 240. Thus it can be seen that in this embodiment modules 220, 230 and 240 are provided as software modules, although in another embodiment these modules may be provided as hardware units. Stream parser 220 inputs the GDSII tapeout and converts it into a format from which a test pattern can be extracted by test pattern extractor 230. The stream parser 220 thus operates in a similar fashion to stream parser 120 and also makes use of additional information in the tapeout comprising product information, foundry information, process information and layer information. For example, stream parser 220 may only parse information relating to a particular layer in which metal-poly contacts are expected to be arranged.

In this example the test pattern extractor 230 operates in a similar fashion to pattern extractor 130 in FIG. 2, in that it identifies contacts in a particular layer of the circuit and extracts their locations. Here, all contacts are extracted, including both the metal-poly contacts and the diffusion contacts. In particular, test pattern extractor 230 extracts the relative origins of the contacts. This set of locations is then passed to scanner 240 which compares this test pattern with each target golden pattern stored in golden pattern database 170 (FIG. 2). Having done so, scanner 240 generates a pattern matching report 250 indicative of whether any of the target golden patterns have been found in the test patterns extracted.

Figure 4:
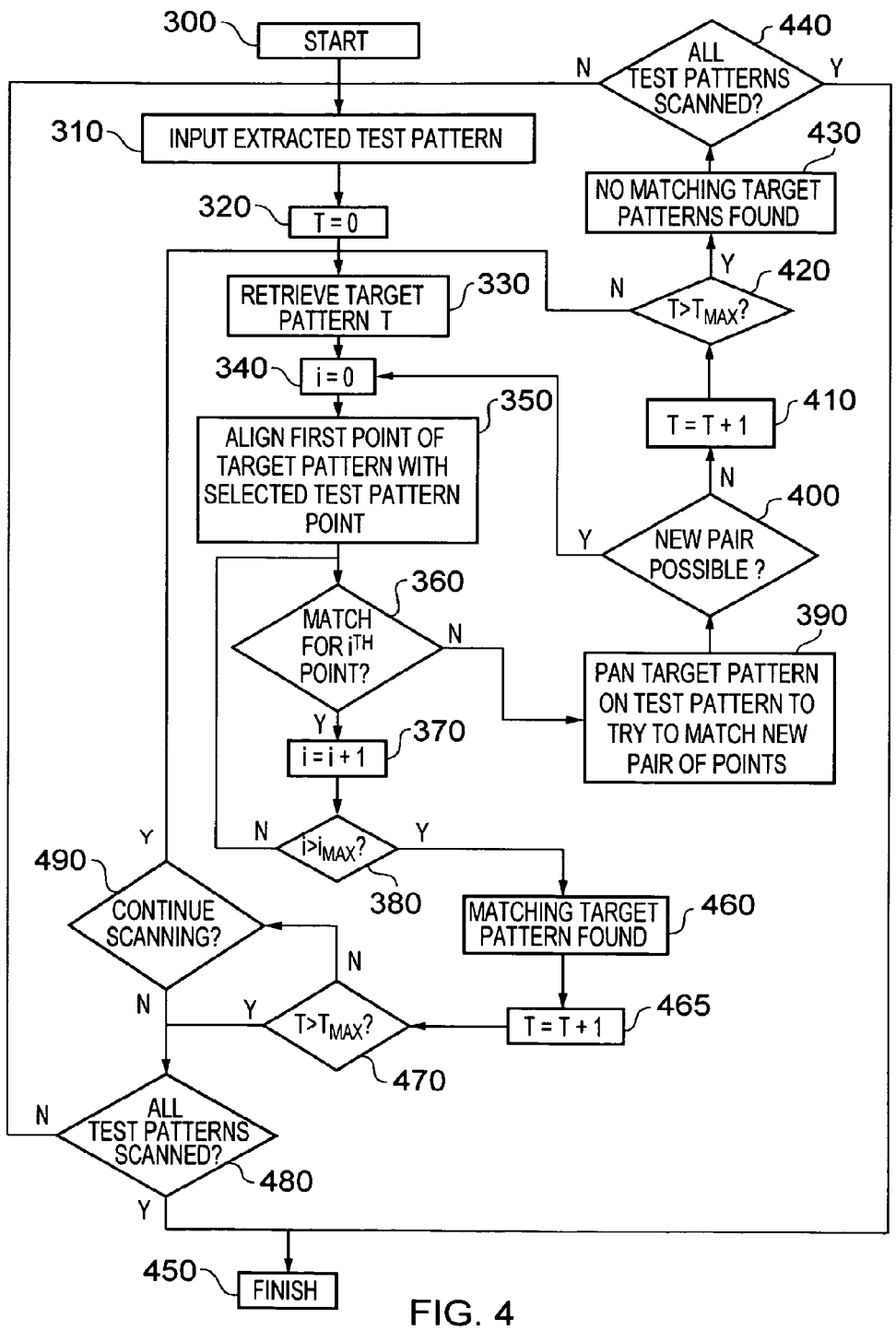
FIG. 4 is a flow diagram illustrating a series of steps performed when comparing a test set of predetermined physical features of a circuit with a characteristic pattern file.

The operation of scanner 240 is now described with reference to the flow diagram illustrated in FIG. 4. The flow begins at step 300 and at step 310 an extracted test pattern is inputted into scanner 240. At step 320 the variable T is set to zero and at step 330 target pattern T is retrieved from the golden pattern database 170. At step 340 the variable i is set to zero and at step 350 the first point of the target pattern is aligned with the first extracted test pattern point. Then, at step 360, it is checked whether there is a match for the $i^{th}$ point of the target pattern. Since the first ($0^{th}$) point of the target pattern has been aligned at step 350 with a point in the test pattern, for this first iteration a match will always been found. At step 370 the variable is incremented by one. At step 380 it is checked if i now exceeds $i_{max}$ ($i_{max}$ being the total number of points in the current target pattern). If i does not exceed $i_{max}$ then the flow returns to step 360 and a iterative process continues checking for a match for the $i^{th}$ point, i.e. cycling through each point of the target pattern to see if it matches with a point in the extracted test pattern. It should be noted that a positive match between a point of the target pattern and the extracted test pattern (step 360) results from the locations of the two points coinciding within a predetermined tolerance. This tolerance is selected by the system administrator such that it is neither too strict (resulting too many false negatives) nor too relaxed (resulting in too many false positives). In this embodiment, the predetermined tolerance is set such that no false positive identifications occur, and such that overall a 6σ confidence level of identification of a given proprietary circuit layout in a circuit under test can be achieved.

If at any stage there is not a match the flow exits the iterative loop and proceeds to step 390, where the target pattern is panned on the test pattern to try to match a pair of points, i.e. it is attempted to align the first point of the target pattern with a new point in the test pattern. This panning is necessary if the extracted test pattern covers a larger area than the target pattern. Panning may in particular be necessary if the tapeout has been 'flattened', i.e. the hierarchical memory-saving structure has, at least partially, been abandoned, such that a given instance of a circuit layout is represented multiple times in the tapeout (rather than occurring in a single instance that is references multiple times). In a more simple scenario there may be no need to pan the target pattern and steps 390 and 400 may effectively be ignored, passing straight to step 410.

If such alignment (i.e. pairing) is possible by panning, then from step 400 the flow returns to step 340, where the variable i is reset to zero. The new first point pair are aligned with one another at step 350 and the iterative matching process of steps 360, 370 and 380 continues. If however a new pair of contacts is not possible, at step 400 the flow proceeds to step 410 where the variable T is incremented by 1. At step 420 it is tested whether T now exceeds $T_{max}$ (i.e. the total number of target patterns in the golden pattern database). If T does exceed $T_{max}$, then at step 430 the scanner 240 generates a pattern matching report 250 indicating that no matching target patterns have been found. At step 440, if more test patterns need to be scanned, the flow returns to step 310 to input the next extracted test pattern. If on the other hand all test patterns have been scanned then the flow concludes at step 450.

Returning to step 380, if i does exceeds $i_{max}$, then the flow proceeds to step 460 where scanner 240 generates a pattern matching report 250 indicating that a matching target pattern has been found. At step 465 T is incremented by one and at step 470 it is tested whether T now exceeds $T_{max}$ (i.e. the total number of target patterns in the golden pattern database). If it does, then at step 480, it is checked if more test patterns need to be scanned. If there are more test patterns to scan, the flow returns to step 310 to input the next extracted test pattern. If on the other hand all test patterns have been scanned the flow concludes at step 450. If at step 470 it is established that T does not exceed $T_{max}$, then the flow proceeds via step 490 where it is determined whether scanning should continue, i.e. whether this extracted test pattern should continue to be tested against other target patterns in the database, despite having already being found to match with one of those target patterns. If scanning should continue, the flow proceeds to step 330. If scanning should not continue, then the flow returns to step 310 and a new extracted test pattern is inputted for scanning.

Figure 5:
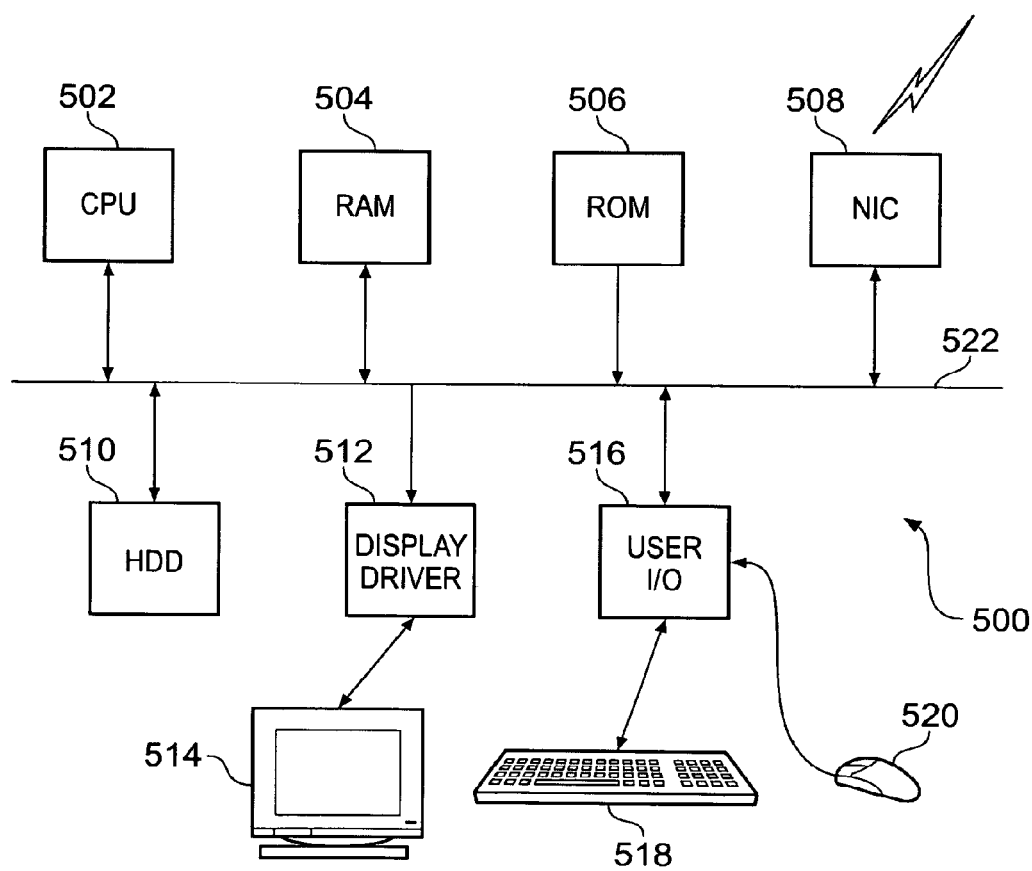
FIG. 5 schematically represents a general purpose computer suitable for carrying out the techniques of the present invention.

FIG. 5 schematically illustrates a general purpose computer 500 of the type that maybe used to implement the above described techniques and in particular the characteristic pattern file generator 110 in FIG. 2 and the pattern comparer 210 in FIG. 3. The general purpose computer 500 includes a central processing unit 502, a random access memory 504, a read only memory 506, a network interface card 508, a hard disc drive 510, a display driver 512 and monitor 514 and a user input output circuit 516 with a keyboard 518 and mouse 520, all connected via a common bus 522. In operation the central processing unit 502 will execute computer program instructions that may be stored in one or more of the random access memory 504, the read only memory 506 and the hard disc drive 510, or dynamically downloaded via the network interface card 508. The results of the processing performed may be displayed to a user via the display driver 512 and a monitor 514. User input for controlling the operation of the general purpose computer 500 may be received via the user input output circuit 516 from the keyboard 518 or mouse 520. It will be appreciated that the computer program can be written in a variety of different computer languages. A computer program may be stored and distributed on a recording medium or dynamically downloaded to the general purpose computer 500. When operating under control of an appropriate computer program, the general purpose computer 500 can perform the above described techniques and can be considered to form an apparatus for performing the above described techniques. In particular the general purpose computer 500 can perform the tasks of both the characteristic pattern file generator 110 in FIG. 2 and the pattern comparer 210 in FIG. 3. The architecture of the general purpose computer 500 could vary considerable and FIG. 5 is only one example.

In summary therefore, according to the techniques of the present invention, a method, apparatus and program are provided for identifying use of a proprietary circuit layout. A representation of a layout of a circuit is inputted and the locations of a set of predetermined physical features of the circuit are identified. This set of locations is then compared with a previously generated characteristic pattern file, the characteristic pattern file comprising a representation of relative locations of a set of predetermined physical features in the proprietary circuit layout. If the set of locations matches the relative locations of the characteristic pattern file, then an output is generated indicating that use of the proprietary circuit layout has been found.

Use of a proprietary circuit layout can thus be determined, only by reference to physical features of the circuit and without the need to refer to additional tagging or watermarking information.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. A method of generating a characteristic pattern file, said pattern file is characteristic of a proprietary circuit layout, the method comprising the steps of:
    inputting a layout database file comprising a representation of said proprietary circuit layout;
    extracting relative locations of a characteristic set of predetermined physical features of said proprietary circuit layout from said layout database file; and
    generating said characteristic pattern file comprising a set of points, said set of points comprising a set of coordinates in a specified coordinate system indicating said relative locations of said characteristic set of predetermined physical features of said proprietary circuit layout, said steps implemented on a computer, wherein, when a count of a first type of predetermined physical features is less than a predetermined lower limit defined by an extraction rule, then at least a second type of predetermined physical features is included in said characteristic set of predetermined physical features,
    wherein said extracting step comprises:
    parsing said layout database file to identify elements indicative of said characteristic set of predetermined physical features; and
    determining said relative locations of said characteristic set of predetermined physical features from said elements.

2. The method as claimed in claim 1, wherein said elements comprise geometric shapes representing said predetermined physical features.

3. The method as claimed in claim 1, wherein said layout database file comprises representations of layouts of a plurality of proprietary circuit layouts.

4. The method as claimed in claim 3, wherein said extracting step comprises selecting said proprietary circuit layout from amongst said plurality of proprietary circuit layouts in dependence on the extraction rule.

5. The method as claimed in claim 1, wherein said parsing step is performed with reference to additional information, said additional information comprising at least one of: product information; foundry information; process information; and layer information.

6. The method as claimed in claim 5, wherein said additional information is contained within tapeout information.

7. The method as claimed in claim 1, wherein said characteristic set of predetermined physical features is disposed in a predetermined layer of said proprietary circuit layout.

8. The method as claimed in claim 1, wherein said extracting step comprises selecting a subset of said predetermined physical features as said characteristic set of predetermined physical features.

9. The method as claimed in claim 1, wherein said characteristic set of predetermined physical features comprises a set of contacts of said proprietary circuit layout.

10. The method as claimed in claim 9, wherein said contacts are metal-poly contacts.

11. The method as claimed in claim 1, wherein said first type of predetermined physical features comprises metal-poly contacts and said second type of predetermined physical features comprises diffusion contacts.

12. The method as claimed in claim 1, wherein said relative locations of said characteristic set of predetermined physical features of said proprietary circuit layout are defined by relative origins of said set of predetermined physical features.

13. The method as claimed in claim 1, wherein said characteristic set of predetermined physical features comprises circuitry components of said proprietary circuit layout.

14. A data processing apparatus for generating a characteristic pattern file, said pattern file is characteristic of a proprietary circuit layout, the data processing apparatus comprising:
    input circuitry configured to input a layout database file comprising a representation of said proprietary circuit layout;
    extraction circuitry configured to extract relative locations of a characteristic set of predetermined physical features of said proprietary circuit layout from said layout database file; and
    generation circuitry configured to generate said characteristic pattern file comprising a set of points, said set of points comprising a set of coordinates in a specified coordinate system indicating said relative locations of said characteristic set of predetermined physical features of said proprietary circuit layout, wherein, when a count of a first type of predetermined physical features is less than a predetermined lower limit defined by an extraction rule, then at least a second type of predetermined physical features is included in said characteristic set of predetermined physical features;
    wherein said extraction circuitry is configured to:
    parse said layout database file to identify elements indicative of said characteristic set of predetermined physical features; and
    determine said relative locations of said characteristic set of predetermined physical features from said elements.

15. A data processing apparatus for generating a characteristic pattern file, said pattern file is characteristic of a proprietary circuit layout, the data processing apparatus comprising:
    input means for inputting a layout database file comprising a representation of said proprietary circuit layout;
    extraction means for extracting relative locations of a characteristic set of predetermined physical features of said proprietary circuit layout from said layout database file; and
    generation means for generating said characteristic pattern file comprising a set of points, said set of points comprising a set of coordinates in a specified coordinate system indicating said relative locations of said characteristic set of predetermined physical features of said proprietary circuit layout, wherein, when a count of a first type of predetermined physical features is less than a predetermined lower limit defined by an extraction rule, then at least a second type of predetermined physical features is included in said characteristic set of predetermined physical features;
    wherein said extracting means comprises:
    means for parsing said layout database file to identify elements indicative of said characteristic set of predetermined physical features; and
    means for determining said relative locations of said characteristic set of predetermined physical features from said elements.

16. A non-transitory computer-readable storage medium storing a computer program which, when executed, causes a computer to perform steps, comprising:
    inputting a layout database file comprising a representation of said proprietary circuit layout;
    extracting relative locations of a characteristic set of predetermined physical features of said proprietary circuit layout from said layout database file; and generating said characteristic pattern file comprising a set of points, said set of points comprising a set of coordinates in a specified coordinate system indicating said relative locations of said characteristic set of predetermined physical features of said proprietary circuit layout, wherein, when a count of a first type of predetermined physical features is less than a predetermined lower limit defined by an extraction rule, then at least a second type of predetermined physical features is included in said characteristic set of predetermined physical features;

wherein said extracting step comprises:
parsing said layout database file to identify elements indicative of said characteristic set of predetermined physical features; and
determining said relative locations of said characteristic set of predetermined physical features from said elements.

17. A method of identifying presence of a proprietary circuit layout in a circuit under investigation, said method comprising the steps of:
inputting a layout database file comprising a representation of said proprietary circuit layout;
extracting relative locations of a characteristic set of predetermined physical features of said proprietary circuit layout from said layout database file;

wherein said extracting step comprises:
parsing said representation to identify elements indicative of said test set of predetermined physical features; and
determining said point locations of said test set of predetermined physical features from said elements;
generating a characteristic pattern file comprising a set of points, said set of points comprising a set of coordinates in a specified coordinate system indicating said relative locations of said characteristic set of predetermined physical features of said proprietary circuit layout, wherein, when a count of a first type of predetermined physical features is less than a predetermined lower limit defined by an extraction rule, then at least a second type of predetermined physical features is included in said characteristic set of predetermined physical features;
inputting a representation of a layout of said circuit under investigation;
identifying point locations of a set of predetermined physical features of said circuit under investigation from said representation;
comparing said point locations with said characteristic pattern file and identifying presence of said proprietary circuit layout in said circuit under investigation; and
generating an output indicative of a result of said comparing step, said steps implemented on a computer.

* * * * *